United States Patent
Wu

(10) Patent No.: US 9,780,323 B2
(45) Date of Patent: Oct. 3, 2017

(54) TANDEM ORGANIC LIGHT EMITTING DIODE AND PREPARATION METHOD THEREOF

(71) Applicant: BOE TECHNOLOGY GROUP CO., LTD., Beijing (CN)

(72) Inventor: Chang Yen Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 26 days.

(21) Appl. No.: 14/419,392

(22) PCT Filed: Jul. 18, 2014

(86) PCT No.: PCT/CN2014/082556
§ 371 (c)(1),
(2) Date: Feb. 3, 2015

(87) PCT Pub. No.: WO2015/101022
PCT Pub. Date: Jul. 9, 2015

(65) Prior Publication Data
US 2016/0028038 A1    Jan. 28, 2016

(30) Foreign Application Priority Data
Dec. 31, 2013    (CN) .......................... 2013 1 0751767

(51) Int. Cl.
*H01L 29/08* (2006.01)
*H01L 51/50* (2006.01)
(Continued)

(52) U.S. Cl.
CPC ...... *H01L 51/5092* (2013.01); *H01L 51/5278* (2013.01); *H01L 51/56* (2013.01)

(58) Field of Classification Search
CPC .......... H01J 1/63; B05D 5/12; H01L 51/5092; H01L 51/5278; H01L 51/56
(Continued)

(56) References Cited

U.S. PATENT DOCUMENTS 6,337,492 B1    1/2002  Jones et al.
8,476,624 B1 *  7/2013  Wu ..................... H01L 51/5004
                                                                  257/40
(Continued)

FOREIGN PATENT DOCUMENTS

CN    101106180 A    1/2008
CN    101379884 A    3/2009
(Continued)

OTHER PUBLICATIONS

First Chinese Office Action of Chinese Application No. 201310751767.3, dated Sep. 15, 2014 with English translation.
(Continued)

*Primary Examiner* — Allen Parker
*Assistant Examiner* — Patricia Reddington
(74) *Attorney, Agent, or Firm* — Collard & Roe, P.C.

(57) ABSTRACT

A tandem organic light emitting diode and a preparation method thereof are provided. The tandem organic light emitting diode includes: at least two light-emitting units (11, 12); a charge generation layer (21) disposed between the light emitting units (11, 12); wherein, the charge generation layer (21) includes a mixed conductive layer (211), and the mixed conductive layer (211) is made by mixing at least one material having a conductivity greater than $10^3$ S/cm with a content of 5~95 wt % and at least one material having a conductivity less than $10^{-6}$ S/cm with a content of 95~5 wt %. The tandem organic light emitting diode is applicable in a display device.

10 Claims, 2 Drawing Sheets

(51) Int. Cl.
*H01L 51/52* (2006.01)
*H01L 51/56* (2006.01)

(58) Field of Classification Search
USPC .......................................................... 257/40
See application file for complete search history.

(56) References Cited

U.S. PATENT DOCUMENTS

| | | | |
|---|---|---|---|
| 8,698,392 | B2 | 4/2014 | Furukawa et al. |
| 2003/0104244 | A1* | 6/2003 | Aziz ................... H01L 51/5012 |
| | | | 428/690 |
| 2006/0263629 | A1 | 11/2006 | Aziz et al. |
| 2007/0085070 | A1* | 4/2007 | Sakata ................. G09G 3/3208 |
| | | | 257/13 |
| 2009/0174315 | A1* | 7/2009 | Furukawa ........... H01L 51/5278 |
| | | | 313/504 |
| 2011/0031476 | A1* | 2/2011 | Oda .................... H01L 51/5036 |
| | | | 257/40 |
| 2011/0079774 | A1 | 4/2011 | Kang et al. |
| 2012/0098012 | A1* | 4/2012 | Kim .................... H01L 27/3209 |
| | | | 257/98 |
| 2015/0014671 | A1* | 1/2015 | Koike ................. C07D 401/10 |
| | | | 257/40 |

FOREIGN PATENT DOCUMENTS

| | | |
|---|---|---|
| CN | 102067730 A | 5/2011 |
| CN | 102456840 A | 5/2012 |
| CN | 103413895 A | 11/2013 |
| CN | 103730586 A | 4/2014 |

OTHER PUBLICATIONS

Chinese Rejection Decision of Chinese Application No. 201310751767.3, dated Jan. 14, 2015 with English translation.
Notification to Grant the Patent Right (Notice of Allowance) for Chinese Patent Application Serial No. CN 201310751767.3 dated on Oct. 29, 2015 with English translation.
The Second Office Action issued for Chinese Patent Application Serial No. CN 201310751767.3 dated Jun. 5, 2015 with English translation.
Issued Patent CN 103730586 (Chinese Patent Application Serial No. CN 201310751767.3) dated Dec. 2, 2015 in Chinese with issued claims translated into English.
International Search Report and Written Opinion of the International Searching Authority with Notice of Transmittal of the International Search Report and Written Opinion of PCT/CN2014/082556 in Chinese, dated Oct. 24, 2014.
English translation of the International Preliminary Report on Patentability and Written Opinion of the International Searching Authority of PCT/CN2014/082556, dated Jul. 5, 2016.

* cited by examiner

TANDEM ORGANIC LIGHT EMITTING DIODE AND PREPARATION METHOD THEREOF

CROSS REFERENCE TO RELATED APPLICATIONS

This application is the National Stage of PCT/CN2014/082556 filed on Jul. 18, 2014, which claims priority under 35 U.S.C. §119 of Chinese Application No. 201310751767.3 filed on Dec. 31, 2013, the disclosure of which is incorporated by reference.

TECHNICAL FIELD

Embodiments of the invention relate to a tandem organic light emitting diode and a preparation method thereof.

BACKGROUND

An Organic Light Emitting Diode (OLED) typically comprises an anode and a cathode, and a light emitting unit located between the anode and the cathode. According to different numbers of light emitting units, OLEDs may be divided into a one-unit OLED and a tandem OLED. The tandem OLED has at least two light emitting units, between which a metal layer or an n-type doping organic layer, etc., may be disposed.

The ideal metal layer is extremely thin and capable of filming. However, in actual process, the excessively thin metal layer, when used for fabricating a relatively large-sized panel, is apt to cause a problem of uniformity for its too small thickness, and even render the tandem OLED unable to function properly. If the metal layer is made too thick, its penetrability will be reduced; and when the metal layer is even thicker, a problem of lateral conductivity will be caused.

SUMMARY OF THE INVENTION

According to one embodiment of the present invention, there is provided a tandem organic light emitting diode, comprising:

at least two light-emitting units;

a charge generation layer disposed between the light emitting units;

wherein, the charge generation layer comprises a mixed conductive layer, and the mixed conductive layer is made by mixing at least one material having a conductivity greater than $10^3$ S/cm with a content of 5~95 wt % and at least one material having a conductivity less than $10^{-6}$ S/cm with a content of 95~5 wt %.

In one example, the material with a conductivity greater than $10^3$ S/cm is ZnO; or the material with a conductivity greater than $10^3$ S/cm is selected from metal oxides formed of at least two of In, Sn, Zn, Al, F, and Ga; or the material with a conductivity greater than $10^3$ S/cm is selected from Cs, Li, Na, K, Al, Ag, Ca, Li and Mg.

In one example, the material with a conductivity greater than $10^3$ S/cm has a conductivity greater than $10^5$ S/cm, and is selected from Cs, Li, Na, K, Al, Ag, Ca, Li and Mg.

For example, the mixed conductive layer has a thickness of 5~10 nm.

For example, the charge generation layer further includes an electron injection layer.

For example, the electron injection layer has a thickness of 0.5~3 nm.

For example, the mixed conductive layer is made of a mixture of Al and $AlQ_3$; and the electron injection layer is made of LiF.

For example, the mixed conductive layer is made of a mixture of Ca and $AlQ_3$; and the electron injection layer is made of $AlQ_3$ and LiQ.

In one example, in the mixed conductive layer, the content of the at least one material having a conductivity greater than $10^3$ S/cm is 45~75 wt %, and the content of the at least one material having a conductivity less than $10^{-6}$ S/cm is 55~25 wt %.

A display device, comprises the tandem organic light emitting diode provided by the embodiment of the present invention.

A preparation method of the tandem organic light emitting diode provided by the embodiment of the present invention, comprises:

fabricating a first light emitting unit;

fabricating a mixed conductive layer on the first light emitting unit, the mixed conductive layer being made by mixing at least one material having a conductivity greater than $10^3$ S/cm with a content of 5~95 wt % and at least one material having a conductivity less than $10^{-6}$ S/cm with a content of 95~5 wt %;

fabricating a second light emitting unit on the mixed conductive layer.

For example, the mixed conductive layer is prepared by a vacuum thermal evaporation method.

The tandem organic light emitting diode and the preparation method thereof provided by the embodiments of the present invention, by disposing a mixed conductive layer made of two materials with different conductivities between the respective light emitting units to provide the tandem organic light emitting diode with a moderate thickness and a moderate conductivity, solves the problem of non-uniformity due to the excessively thin metal layer in the prior art, and also solves the problems of low penetrability and lateral conductivity caused by excessively high conductivity of the relatively thick metal layer.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

A tandem organic light emitting diode and a preparation method thereof provided by the embodiments of the present invention are further described in detail hereinafter in conjunction with the accompanying drawings.

Figure 1:
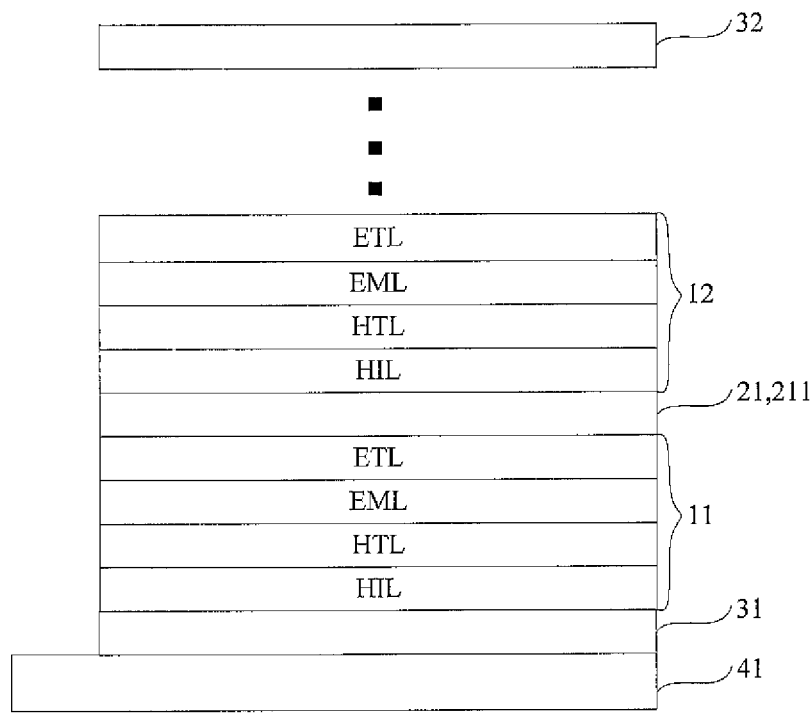
FIG. 1 is a structural schematic diagram of a tandem organic light emitting diode provided by an embodiment of the present invention.

An embodiment of the present invention provides a tandem organic light emitting diode, as illustrated in FIG. 1, it is a structural schematic diagram of a tandem organic light emitting diode, comprising: at least two light-emitting units 11 and 12.

As illustrated in FIG. 1, the light emitting unit 11 may comprise a hole injection layer (HIL), a hole transport layer (HTL), an light emitting material layer (EML), an electron transport layer (ETL), etc. It can be appreciated that the above are only illustrative, and this embodiment does not specifically limit a structure of the light emitting unit 11, which can be set according to actual situations.

A charge generation layer (CGL) is disposed between the respective light emitting units; e.g., a charge generation layer 21 disposed between the light-emitting units 11 and 12 in FIG. 1. The charge generation layer 21 plays a role of communicating the respective light emitting milts. The charge generation layer 21 may further comprise a mixed conductive layer 211, which is made by mixing at least one material having a conductivity greater than $10^3$ S/cm with a content of 5~95 wt % and at least one material having a conductivity less than $10^{-6}$ S/cm with a content of 95~5 wt %. For example, the mixed conductive layer 211 is made by mixing at least one material having a conductivity greater than $10^3$ S/cm with a content of 45~75 wt % and at least one material having a conductivity less than $10^{-6}$ S/cm with a content of 55~25 wt %.

For example, the material with a conductivity greater than $10^3$ S/cm is selected from $AlQ_3$, ITO, IZO, AZO, FTO, ZnO, ZITO and GITO; or selected from metal oxides consisting of at least two of In, Sn, Zn, Al, F, and Ga; or selected from Cs, Li, Na, K, Al, Ag, Ca, Li and Mg. The material with a conductivity less than $10^{-6}$ S/cm is mostly an organic material or some certain metal oxides. In one example, the material with a conductivity greater than $10^3$ S/cm has a conductivity greater than $10^5$ S/cm, and is selected from Cs, Li, Na, K, Al, Ag, Ca, Li and Mg.

It can be appreciated that the mixed conductive layer 211 is made by mixing a material with a high conductivity (greater than $10^3$ S/cm) and a material with a low conductivity (less than $10^{-6}$ S/cm), to obtain the mixed conductive layer 211 with suitable conductive properties. The material with a high conductivity may be one of the above-exemplified materials, or may be a mixture of two or more of the above-exemplified materials. The mixture may be, for example, a mixture of two or more metal oxides or a mixture of two or more metals or the like, or may be a mixture of a metal and a metal oxide. Likewise, the material with a low conductivity may be a certain organic material or metal oxide, and may be a mixture of organic materials, a mixture of metal oxides, or a mixture of an organic material and a metal oxide. For example, the material with a low conductivity may be $AlQ_3$, NPB, TCTA, HATCN, etc.

In the present invention, since the material having a high conductivity (greater than $10^3$ S/cm) with a content of 5~95 wt % and the material having a low conductivity (less than $10^{-6}$ S/cm) with a content of 95~5 wt % are mixed, the conductivity of the mixed conductive layer 211 finally obtained is usually between $10^{-6}$ S/cm and $10^3$ S/cm, i.e., an average conductivity decreases, and therefore, the thickness of the mixed conductive layer can be increased to 4~15 nm, so as to avoid the problem of uniformity caused by the excessively thin mixed conductive layer. Moreover, although the thickness of the mixed conductive layer 211 is in the range of 4~15 nm, yet since the material with a high conductivity and the material with a low conductivity are mixed and doped with each other, the lateral conductivity will not be caused by the excessively thick mixed conductive layer 211.

In addition, an anode 31 and a cathode 32 are respectively disposed on outer sides of the light-emitting units on both ends, and the anode and the cathode commonly used in the art can be selected, which will not be described more here. The anode 31 may be disposed on a transparent substrate 41.

The tandem organic light emitting diode provided by the embodiment of the present invention, by disposing the mixed conductive layer made of two materials with different conductivities between the respective light emitting units to provide the tandem organic light emitting diode with a moderate thickness and a moderate conductivity, solves the problem of non-uniformity due to the excessively thin metal layer in the prior, art, and also solves the problems of low penetrability and lateral conductivity caused by an excessively high conductivity of the relatively thick metal layer.

In another embodiment of the present invention, the mixed conductive layer 211 may be a mixture of Al and $AlQ_3$. In still another embodiment, the mixed conductive layer 211 may also be a mixture of Ca and $AlQ_3$, wherein Q represents an 8-hydroxyquinoline group.

Alternatively, in still another embodiment of the present invention, the mixed conductive layer 211 may have a thickness of 5~10 nm. In some examples, the mixed conductive layer 211 may have a thickness of 6 nm, 7 nm, 8 nm or 9 nm.

Figure 2:
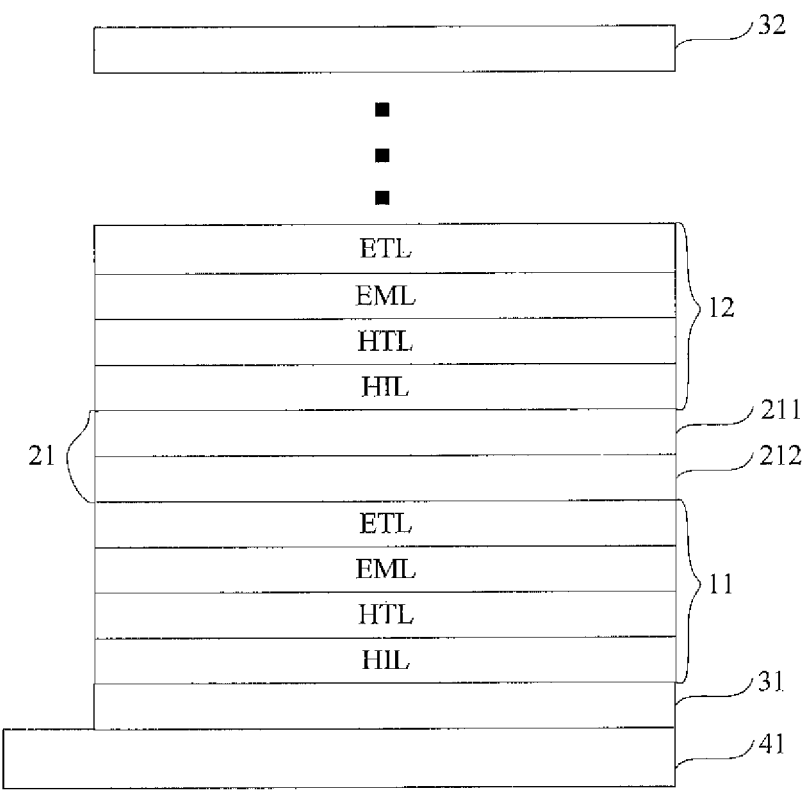
FIG. 2 is a structural schematic diagram of a tandem organic light emitting diode provided by another embodiment of the present invention.

Alternatively, in still another embodiment provided by the present invention, in order to provide a better luminous efficiency of the tandem organic light emitting diode, as illustrated in FIG. 2, the charge generation layer 21 further comprises an electron injection layer (EIL) 212. In each charge generation layer 21, a relative positional relationship between the electron injection layer 212 and the mixed conductive layer 211 is that the electron injection layer 212 is located on a side close to the cathode, and the mixed conductive layer 211 is located on a side close to the anode. Thus, the electrons generated by the cathode can be injected from the light emitting unit close to the cathode to the adjacent light emitting unit close to the anode via the electron injection layer 212.

For example, the electron injection layer 212 may be made of LiF. In another example, the electron injection layer 212 may further be made of a mixture of $AlQ_3$ and LiQ, wherein Q represents the 8-hydroxyquinoline group.

In one embodiment, the electron injection layer 212 may have a thickness of 0.5~3 nm. Specifically, the electron injection layer 212 may have a thickness of 0.7 nm, 1 nm, 2 nm, and 2.5 nm.

Corresponding to the tandem organic light emitting diode mentioned above, an embodiment of the present invention thither provides a display device, comprising the tandem organic light emitting diode.

The embodiment of the present invention provides a display device comprising the Tandem organic light emitting diode, the latter of which, by disposing a mixed conductive layer made of two materials with different conductivities between the respective light emitting units to provide the tandem organic light emitting diode with a moderate thickness and a good conductivity, and solves the problem of non-uniformity due to the excessively thin metal layer in the prior art. Further, a large-sized display device may be provided. Also, due to a good conductivity, the problem of lateral conductivity in the prior art is solved.

Corresponding to the above-described tandem organic light emitting diode, an embodiment of the present invention further provides a preparation method thereof, comprising:

101: fabricating a first light emitting unit;

102: fabricating a mixed conductive layer on the first light emitting unit, the mixed conductive layer being made by mixing at least one material having a conductivity greater than $10^3$ S/cm with a content of 5~95 wt % and at least one material having a conductivity less than $10^{-6}$ S/cm with a content of 95~5 wt %;

Alternatively, the mixed conductive layer is prepared by a vacuum thermal evaporation method.

103: fabricating a second light emitting unit on the mixed conductive layer.

In the preparation method of the tandem organic light emitting diode provided by the embodiment of the present invention, the tandem organic light emitting diode being prepared, by disposing a mixed conductive layer made of two materials with different conductivities between the respective light emitting units to provide the tandem organic light emitting diode with a moderate thickness and a moderate conductivity, solves the problem of non-uniformity due to the excessively thin metal layer in the prior art, and also solves the problems of low penetrability and lateral conductivity caused by excessively high conductivity of the relatively thick metal layer. Further, a large-sized display device may be prepared. Also, due to a good conductivity, the problem of lateral conductivity in the prior art is solved.

To better illustrate the tandem organic light emitting diode provided by the embodiment of the present invention, the specific embodiments are provided as follows for description.

Embodiment 1

Figure 3:
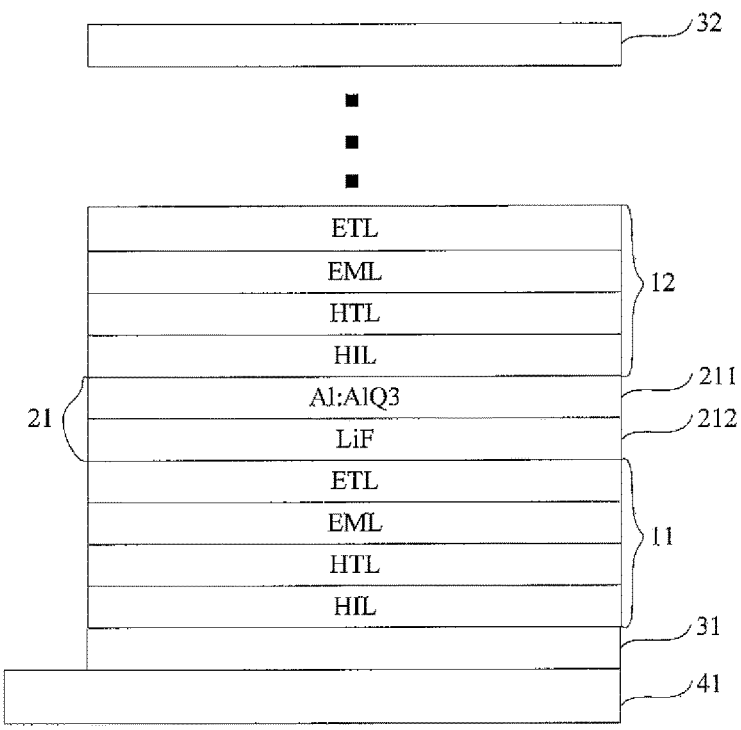
FIG. 3 is a structural schematic diagram of a tandem organic light emitting diode provided by Embodiment 1 of the present invention.

As illustrated in FIG. 3, Embodiment 1 provides a tandem organic light emitting diode, comprising sequentially, a transparent substrate 41, an anode 31, a first light emitting unit 11, a charge generation layer 21, a second light emitting unit 12, and more charge generation layers and light emitting units, and a cathode 32. The charge generation layer 21 comprises a mixed conductive layer 211 made by mixing 40 wt % of Al and 60 wt % of $AlQ_3$, and an electron injection layer 212 made of LiF. The mixed conductive layer 211 has a thickness of 6 nm, and the electron injection layer 212 has a thickness of 2.6 nm.

Embodiment 2

Figure 4:
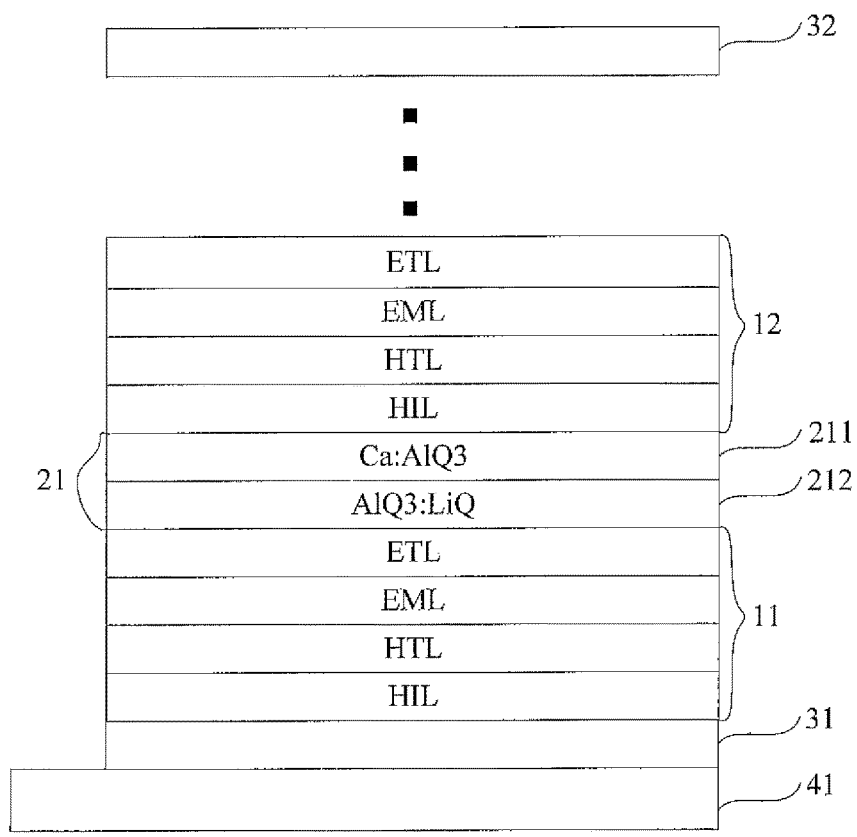
FIG. 4 is a structural schematic diagram of a tandem organic light emitting diode provided by Embodiment 2 of the present invention.

As illustrated in FIG. 4, Embodiment 2 provides a tandem organic light emitting diode, comprising sequentially, a transparent substrate 41, an anode 31, a first light emitting unit 11, a charge generation layer 21, a second light emitting unit 12, and more charge generation layers and light emitting units, and a cathode 32. The charge generation layer 21 comprises a mixed conductive layer 211 made by mixing 65 wt % of Ca and 35 wt % of $AlQ_3$, and an electron injection layer 212 made by mixing $AlQ_3$ and $LiQ_3$. The mixed conductive layer 211 has a thickness of 5.5 nm, and the electron injection layer 212 has a thickness of 1.2 nm.

The foregoing embodiments merely are exemplary embodiments of the invention, and not intended to define the scope of the invention, and the scope of the invention is determined by the appended claims.

The present application claims priority of Chinese Patent Application No. 201310751767.3 filed on Dec. 31, 2013, the disclosure of which is incorporated herein by reference in its entirety as part of the present application.

The invention claimed is:

1. A tandem organic light emitting diode, comprising:
    at least two light-emitting units;
    a charge generation layer disposed between the light emitting units;
    wherein, the charge generation layer comprises a mixed conductive layer, and the mixed conductive layer is made by mixing at least one material having a conductivity greater than $10^3$ S/cm with a content of 45~75 wt % and at least one material having a conductivity less than $10^{-6}$ S/cm with a content of 55~25 wt %, and the charge generation layer further comprises an electron injection layer;
    wherein, the material with a conductivity greater than $10^3$ S/cm is selected from ITO, IZO, AZO, FTO, ZnO, ZITO and GITO; or the material with a conductivity greater than $10^3$ S/cm is selected from metal oxides consisting of at least two of In, Sn, Zn, Al, F, and Ga.

2. The tandem organic light emitting diode according to claim 1, wherein, the mixed conductive layer has a thickness of 5~10 nm.

3. The tandem organic light emitting diode according to claim 1, wherein, the electron injection layer has a thickness of 0.5~3 nm.

4. A display device, comprising the tandem organic light emitting diode according to claim 1.

5. A preparation method of the tandem organic light emitting diode according to claim 1, comprising:
    fabricating a first light emitting unit;
    fabricating a mixed conductive layer on the first light emitting unit, the mixed conductive layer being made by mixing at least one material having a conductivity greater than $10^3$ S/cm with a content of 45~75 wt % and at least one material having a conductivity less than $10^{-6}$ S/cm with a content of 55~25 wt %; and
    fabricating a second light emitting unit on the mixed conductive layer.

6. The preparation method according to claim 5, wherein, the mixed conductive layer is prepared by a vacuum thermal evaporation method.

7. The tandem organic light emitting diode according to claim 3, wherein, the electron injection layer is made of LiF.

8. The tandem organic light emitting diode according to claim 3, wherein, the electron injection layer is made of $AlQ_3$ and LiQ.

9. The tandem organic light emitting diode according to claim 1, wherein, the material having a conductivity less than $10^{-6}$ S/cm is selected from the group consisting of AlQ3, NPB, TCTA and HATCN.

10. The preparation method according to claim 5, wherein the material having a conductivity less than $10^{-6}$ S/cm is selected from the group consisting of AlQ3, NPB, TCTA and HATCN.

* * * * *